United States Patent
Kim et al.

(10) Patent No.: US 8,889,481 B2
(45) Date of Patent: Nov. 18, 2014

(54) SEMICONDUCTOR DEVICE AND METHOD FOR MANUFACTURING THE SAME

(71) Applicant: SK Hynix Inc., Icheon-si (KR)

(72) Inventors: Jong Hoon Kim, Suwon-si (KR); Pil Soon Bae, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 25 days.

(21) Appl. No.: 13/841,957

(22) Filed: Mar. 15, 2013

(65) Prior Publication Data
US 2014/0145343 A1      May 29, 2014

(30) Foreign Application Priority Data
Nov. 29, 2012   (KR) ................ 10-2012-0136907

(51) Int. Cl.
*H01L 21/00*   (2006.01)
*H01L 23/00*   (2006.01)

(52) U.S. Cl.
CPC ............. *H01L 24/19* (2013.01); *H01L 24/18* (2013.01)
USPC ........... 438/106; 257/737; 257/738; 257/777; 101/450.1

(58) Field of Classification Search
CPC . H01L 23/3114; H01L 21/563; H01L 23/498; H01L 24/01; H01L 24/10; H01L 2224/95115
USPC ......... 257/737, 738, 777; 438/106; 101/450.1
See application file for complete search history.

(56) References Cited

U.S. PATENT DOCUMENTS

| | | | |
|---|---|---|---|
| 7,800,240 B2 | 9/2010 | Yu | |
| 8,610,267 B2 * | 12/2013 | Yang et al. | 257/737 |
| 8,653,676 B2 * | 2/2014 | Kim et al. | 257/790 |
| 2011/0074027 A1* | 3/2011 | Kwon | 257/737 |
| 2011/0318876 A1* | 12/2011 | Lee et al. | 438/113 |

FOREIGN PATENT DOCUMENTS

| | | |
|---|---|---|
| KR | 1020120055748 A | 6/2012 |
| KR | 1020120011768 A | 8/2012 |

* cited by examiner

*Primary Examiner* — David Vu
*Assistant Examiner* — Brandon Fox
(74) *Attorney, Agent, or Firm* — William Park & Associates Patent Ltd.

(57) ABSTRACT

A semiconductor device comprises: a semiconductor structure formed with openings for exposing pads on an one surface thereof, a first conductive layer formed in the openings to make the one surface of the semiconductor structure more uniform, and conductive patterns formed on portions of the one surface of the semiconductor structure including the first conductive layers.

18 Claims, 8 Drawing Sheets

SEMICONDUCTOR DEVICE AND METHOD FOR MANUFACTURING THE SAME

CROSS-REFERENCE TO RELATED APPLICATIONS

The present application claims priority to Korean Patent Application Number 10-2012-0136907 filed in the Korean Intellectual Property Office on Nov. 29, 2012, which is incorporated herein by reference in its entirety.

BACKGROUND

1. Technical Field

The present invention relates generally to a semiconductor device and a method for manufacturing the same, and more particularly, to a semiconductor device having conductive patterns such as bumps, redistribution lines, and the like and a method for manufacturing the same.

2. Related Art

Recent trends in the electronic industry are directed to manufacturing products to achieve weight reduction, device miniaturization, high speed operation, multi-functionality, high performance, high reliability, and low manufacturing cost. Package assembling technology is considered an important aspect for achieving many of the above described features in product design.

Package assembling technology is used to protect a semiconductor chip formed with integrated circuits from an external environment and to allow the semiconductor chip to be easily mounted on a substrate in order to maintain reliable operation of the semiconductor chip. In order to assemble a semiconductor chip into a package, conductive patterns such as bumps, redistribution lines, and the like are formed on the semiconductor chip.

A photolithography process is generally used to form conductive patterns such as bumps, redistribution lines, and the like, and comprises sequentially forming an adhesive layer and a seed layer on an active surface of a semiconductor chip on which pads are disposed, coating a photoresist on the seed layer, patterning the photoresist using exposure and development processes to partially expose the seed layer, forming conductive patterns such as bumps, redistribution lines, and the like at portions of the seed layer exposed by the patterned photoresist using an electroplating process, removing the photoresist, and etching the seed layer and the adhesive layer using the conductive patterns as a mask.

However, the problems with the photolithography process to form conductive patterns include complex manufacturing steps and high manufacturing cost since it requires many process steps such as forming of the adhesive layer and the seed layer, photoresist application, exposure, development, electroplating, photoresist removal, and etching of the adhesive layer and the seed layer as described above.

BRIEF SUMMARY

Various embodiments are generally directed to a semiconductor device which can be manufactured through a simpler process and has improved mechanical and electrical reliability, and a method for manufacturing the same.

In one embodiment, a semiconductor device comprises: a semiconductor structure formed with openings for exposing pads on an one surface thereof, a first conductive layer formed in the openings, and conductive patterns formed on portions of the one surface of the semiconductor structure including the first conductive layers, wherein the one surface of the semiconductor structure and the first conductive layer are substantially coplanar.

The first conductive layer may include at least one of Ni, Ni alloy, Au, Au alloy, Pt, and Pt alloy.

The conductive patterns may be any one of a bump and a redistribution line. The conductive patterns may include any one of Ag paste, a material including Ag paste and polymer, and a material including Cu paste and polymer.

The semiconductor structure comprises any one of a semiconductor chip and a printed circuit board.

The semiconductor device may further comprise second conductive layers formed on the conductive patterns.

The second conductive layer may be an electroless plating layer.

The second conductive layer may be formed so as to surround the conductive patterns.

The second conductive layer may be formed on only a portion of the conductive patterns.

The second conductive layer may include at least one of Ni, Ni alloy, Au, Au alloy, Pt, and Pt alloy.

The semiconductor device may further comprise an additional semiconductor structure having connection electrodes electrically connected with the second conductive layers.

The additional semiconductor structure may include any one of a semiconductor chip and a printed circuit board.

The semiconductor device may further comprise conductive connection members electrically connecting the second conductive layers and the connection electrodes of the additional semiconductor structure.

In another embodiment, a method for manufacturing a semiconductor device comprises: preparing a semiconductor structure formed with openings for exposing pads on an one surface thereof, forming a first conductive layer in the openings to make the one surface of the semiconductor structure more uniform, and forming conductive patterns on portions of the one surface of the semiconductor structure including the first conductive layer with a roll printing process.

Forming the first conductive layer may comprise: forming a conductive layer over the one surface including the openings to fill the openings, and polishing the conductive layer such that only the conductive layer remains in the openings.

Alternatively, forming the first conductive layer may comprise filling conductive paste in the openings and sintering the conductive paste filled in the openings.

The first conductive layer may comprise at least one of Ni, Ni alloy, Au, Au alloy, Pt, and Pt alloy.

Forming the conductive patterns may comprise: a unit cycle process comprising of forming patterns of conductive ink composition in recessed portions of a cliché on which patterns corresponding to the conductive patterns are recessed, joining a roller with the cliché to transfer the patterns of the conductive ink composition on the cliché onto the roller, and transferring the patterns of the conductive ink composition on the roller onto the one surface of the semiconductor structure including the first conductive layer, wherein the unit cycle process is repeated at least one time.

Forming the conductive patterns may comprise: a unit cycle process consisting of coating a conductive ink composition on a roller, joining a cliché, on which patterns corresponding to the conductive patterns are recessed, with the roller to form patterns of the conductive ink composition on the roller that corresponds to the conductive patterns on the roller, and transferring the patterns of the conductive ink composition on the roller onto the one surface of the semiconductor structure including the first conductive layer, wherein the unit cycle process is repeated at least one time.

The method may further comprise sintering the conductive patterns after forming the conductive patterns.

The conductive patterns comprise any one of a bump and a redistribution line.

The conductive patterns comprise any one of Ag paste, a material including Ag paste and polymer, and a material including Cu paste and polymer.

The method may further comprise: forming second conductive layers on the conductive patterns after forming the conductive patterns.

Forming the second conductive layer may be carried out using an electroless plating process, and the second conductive layer may include at least one of Ni, Ni alloy, Au, Au alloy, Pt, and Pt alloy.

Forming the second conductive layer may be carried out in such a manner that the second conductive layer is formed on the entire surface of the conductive patterns. Alternatively, forming the second conductive layer may be carried out in such a manner that the second conductive layer is formed on a portion of the conductive patterns.

DESCRIPTION OF SPECIFIC EMBODIMENTS

Hereafter, various embodiments of the present invention will be described in detail with reference to the accompanying drawings.

Figure 1A:
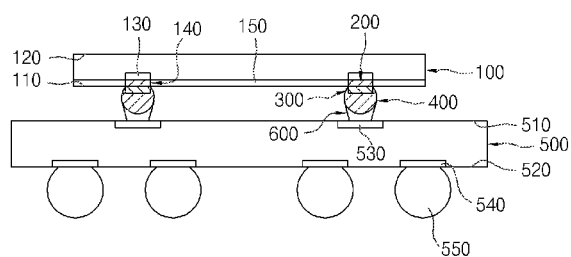
FIGS. 1A and 1B are a cross-sectional view illustrating a semiconductor device in accordance with an embodiment.
Figure 1B:
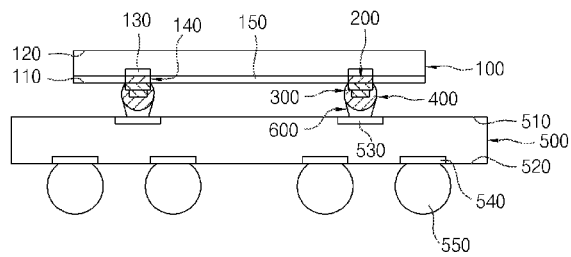

FIGS. 1A and 1B is a cross-sectional view illustrating a semiconductor device in accordance with an embodiment.

A semiconductor device in accordance with an embodiment comprises a semiconductor structure 100, a first conductive layer 200, and conductive patterns 300. The semiconductor device further comprises a second conductive layer 400, an additional semiconductor structure 500, and conductive connection members 600.

The semiconductor structure 100 has one surface 110 and the other surface 120 opposite to the one surface 110. Openings 140 exposing pads 130 are formed on the one surface 110 of the semiconductor structure 100. Reference numeral 150 denotes a passivation layer. In the present embodiment, the semiconductor structure 100 may be formed of a semiconductor chip. Alternatively, the semiconductor structure 100 may be formed of a Printed Circuit Board (PCB).

The conductive patterns 300 may be formed through a roll printing process. The roll printing process refers to a method of forming patterns by joining a roller, on which patterns of ink composition corresponding to the desired patterns are formed, with a base onto which the patterns of the ink composition are transferred. The advantages of the roll printing process includes being a simpler process and having low manufacturing cost, in that the patterns are formed by transferring the patterns of ink composition on the roller directly onto the base. However, mechanical defects such as pattern lifting, peeling, and the like may occur during the roll printing process unless the base onto which the pattern transfer is performed is maintains a flat surface. However, since the semiconductor structure 100 is formed with the openings 140 for exposing the pads 130 on its the one surface 110, a flat surface cannot be ensured, the mechanical reliability cannot be ensured when the roll printing process is applied to form the conductive patterns 300.

In accordance with the present embodiment, a first conductive layer 200 is formed in the openings 140 to make the one surface 110 of the semiconductor structure 100 more uniform. In other words, the first conductive layer 200 is formed to fill the openings 140 such that a height difference generated in the one surface 110 of the semiconductor structure 100 due to the openings 140 is removed, thereby allowing the one surface 110 of the semiconductor structure 100 to be more uniform. As a result, the one surface of the semiconductor structure and the first conductive layer are substantially coplanar.

The first conductive layer 200 may include at least one of Ni, Ni alloy, Au, Au alloy, Pt, and Pt alloy.

The conductive patterns 300 are formed using the roll printing process over some portions of the one surface 110 of the semiconductor structure 100 including the first conductive layer 200. In the present embodiment, the conductive patterns 300 are formed as bumps. Although the width of the conductive patterns 300 is illustrated and described as being substantially similar as the width of the opening 140 shown in FIGS. 1A and 1B, the width of the conductive patterns 300 may be larger or smaller than the width of the opening 140.

Furthermore, the conductive patterns 300 may be a single print layer formed through a one-time roll printing process as shown in FIG. 1A or may have a structure in which a plurality of such single print layers is stacked in at least two layers as shown in FIG. 1B.

The conductive patterns 300 may include any one of Ag paste, a conductive material including Ag paste and polymer, and a conductive material including Cu paste and polymer. A thickness of the single print layer formed through the one-time roll printing process is two to ten times thicker when the single print layer is formed using a conductive material with polymer than when the single print layer is formed using a conductive material with no polymer. Therefore, a conductive material including polymer may be used in order to form thicker conductive patterns 300.

Since the conductive patterns 300 formed by the roll printing process exhibit poor adhesiveness to solder, a second conductive layer 400 may be formed over the conductive patterns 300 through an electroless plating process. In the present embodiment, the second conductive layer 400 is formed over the entire surface of the conductive patterns 300 so as to encompass the conductive patterns 300. The second conductive layer 400 may include at least one of Ni, Ni alloy, Au, Au alloy, Pt, and Pt alloy.

The additional semiconductor structure 500 has one surface 510 facing the semiconductor structure 100 and the other surface 520 opposite to the one surface 510. The additional semiconductor structure 500 has connection electrodes 530 formed to be electrically connected with the second conductive layer 400 on the one surface 510 thereof. The additional semiconductor structure 500 may be formed of a printed circuit board. Reference numerals 540 and 550 denote ball lands and solder balls, respectively.

Although the additional semiconductor structure 500 is illustrated and described as being a printed circuit board in the present embodiment, the additional semiconductor structure 500 may be a semiconductor chip.

Conductive connection members 600 are formed between the second conductive layer 400 and the connection electrode 530 of the additional semiconductor structure 500 to electrically connect the second conductive layer 400 and the connection electrode 530. The conductive connection member 600 may include a solder.

Figure 2:
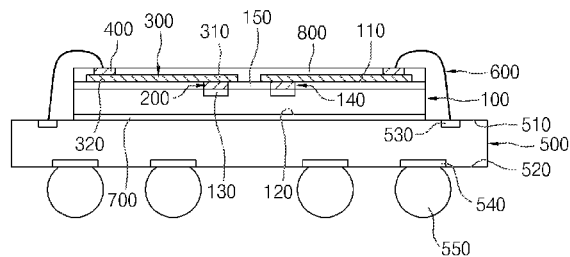
FIG. 2 is a cross-sectional view illustrating a semiconductor device in accordance with another embodiment

FIG. 2 is a cross-sectional view illustrating a semiconductor device in accordance with another embodiment.

A semiconductor device in accordance with another embodiment comprises a semiconductor structure 100, a first conductive layer 200, and conductive patterns 300. The semiconductor device further comprises a second conductive layer 400, an additional semiconductor structure 500, conductive connection members 600, and adhesive members 700.

The semiconductor structure 100 has one surface 110 and the other surface 120 opposite to the one surface 110, is formed on its one surface 110 with openings 140 for exposing pads 130. Reference numeral 150 denotes a passivation layer.

In the present embodiment, the semiconductor structure 100 is formed of a semiconductor chip, or may alternatively be a printed circuit board.

The first conductive layer 200 is formed to fill the openings 140 such that a height difference generated in the one surface 110 of the semiconductor structure 100 due to the openings 140 is removed, thereby allowing the one surface 110 of the semiconductor structure 100 to be more uniform. The first conductive layer 200 may include at least one of Ni, Ni alloy, Au, Au alloy, Pt, and Pt alloy.

The conductive patterns 300 are formed using a roll printing process over some portions of the one surface 110 of the semiconductor structure 100 including the first conductive layer 200. In the present embodiment, the conductive patterns 300 are formed as redistribution lines. One end 310 of the conductive patterns 300 is connected with the first conductive layer 200 and the other end 320 opposite to the one end 310 is disposed on an edge of the one surface 110 of the semiconductor structure 100. Furthermore, an insulation layer 800 that exposes the other end 320 of the conductive patterns 300 is formed over the one surface 110 of the semiconductor structure 100 including the conductive patterns 300.

The conductive patterns 300 may be a single print layer formed through a one-time roll printing process or may have a structure in which a plurality of such single print layers is stacked in at least two layers.

The conductive patterns 300 may include at least one of Ag paste, a conductive material including Ag paste and polymer, and a conductive material including Cu paste and polymer. A thickness of the single print layer formed through the one-time roll printing process is two to ten times thicker when the single print layer is formed using a conductive material with polymer than when the single print layer is formed using a conductive material with no polymer. Therefore, a conductive material including polymer may be used in order to form thicker conductive patterns 300.

In the present embodiment, the second conductive layer 400 is formed over the other end 320 of the conductive patterns 300 exposed by the insulation layer 800. The second conductive layer 400 may be an electroless plating layer that is grown from the surface of the other end 320 of the conductive patterns 300 exposed by the insulation layer 800, and may include at least one of Ni, Ni alloy, Au, Au alloy, Pt, and Pt alloy.

Furthermore, the other surface 120 of the semiconductor structure 100 is attached to the additional semiconductor structure 500 by the medium of the adhesive member 700.

The additional semiconductor structure 500 has one surface 510 facing the semiconductor structure 100 and the other surface 520 opposite to the one surface 510, and is formed on its one surface 510 with connection electrodes 530 electrically connected with the second conductive layer 400. In the present embodiment, the additional semiconductor structure 500 may be formed of a printed circuit board. Reference numerals 540 and 550 denote ball lands and solder balls, respectively. Although the additional semiconductor structure 500 is illustrated and described as being a printed circuit board in the present embodiment, the additional semiconductor structure 500 may be a semiconductor chip.

The conductive connection member 600 is formed between the second conductive layer 400 and the connection electrode 530 of the additional semiconductor structure 500 to electrically connect the second conductive layer 400 and the connection electrode 530. In the present embodiment, the conductive connection member 600 may include a wire.

Hereinafter, a method of forming the above-described semiconductor device will be described.

FIGS. 3 to 9 are cross-sectional views illustrating the process steps of forming a semiconductor device in accordance with an embodiment.

Figure 3:
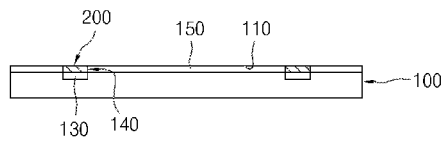
FIGS. 3 to 9 are cross-sectional views illustrating the process steps of forming a semiconductor device in accordance with an embodiment.

In FIG. 3, a first conductive layer 200 is formed to fill the openings 140 of a semiconductor structure 100, which is formed on its one surface 110 with the openings for exposing pads 130, such that a height difference generated in the one surface 110 of the semiconductor structure 100 due to the openings 140 is removed, thereby allowing the one surface 110 of the semiconductor structure 100 to be more uniform.

Figure 4:
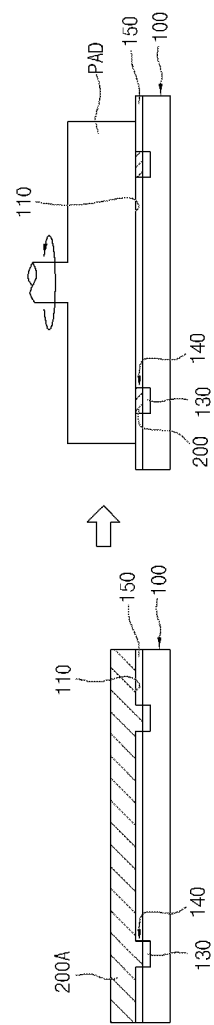

The first conductive layer 200 may be formed in such a manner as shown in FIG. 4, of forming a conductive layer 200A over the one surface 110 of the semiconductor structure including the openings 140 using an electroless plating process or an electroplating process to fill the openings 140 and then polishing the conductive layer 200A by way of chemical mechanical polishing (CMP) so as to restrict the conductive layer 200 within the insides of the openings 140. The reference symbol PAD denotes a polishing pad of a CMP machine.

Figure 5:
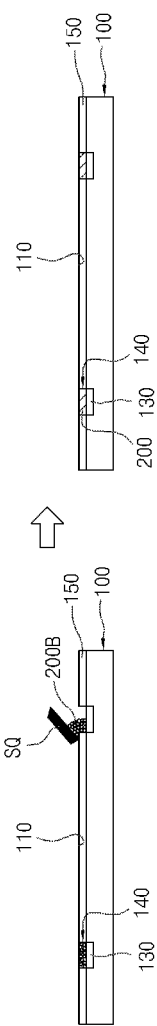

Alternatively, as shown in FIG. 5, the first conductive layer 200 may be formed in such a manner of coating conductive paste 200B on the one surface 110 of the semiconductor structure 100 using a squeezer SQ to fill the openings 140 and then sintering the conductive paste filled in the openings 140.

The first conductive layer 200 may include at least one of Ni, Ni alloy, Au, Au alloy, Pt, and Pt alloy.

Figure 6:
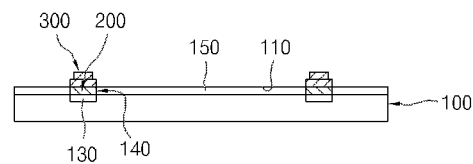
Figure 7:
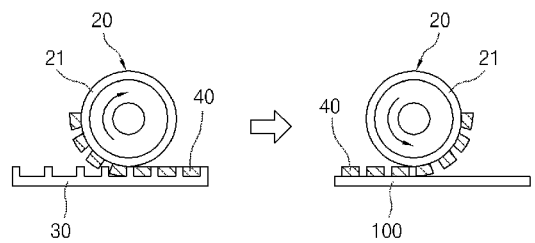

Referring to FIGS. 6 and 7, conductive patterns 300 are formed using a roll printing process over some portions of the one surface 110 of the semiconductor structure 100 including the first conductive layer 200.

The roll printing process may be carried out in such a manner to fill conductive ink composition in recessed portions of a cliché 30 on which patterns corresponding to the conductive patterns are recessed to form patterns 40 of the conductive ink composition, joining a blanket 21 on an outer surface of a roller 20 with the cliché 30 to transfer the patterns 40 of the conductive ink composition formed in the recessed portions of the cliché 30 onto the blanket 21, and then joining the blanket 21 with the semiconductor structure 100 to transfer the patterns 40 of the conductive ink composition on the blanket 21 onto the semiconductor structure 100.

Figure 8:
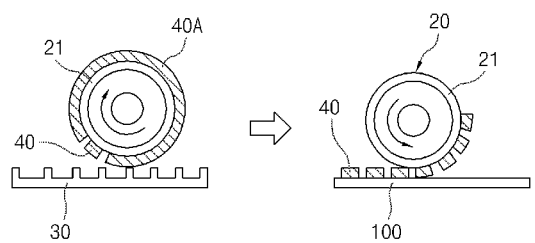

Alternatively, the roll printing process may be carried out, as shown in FIG. 8, in such a manner of coating conductive ink composition 40A on a blanket 21 of a roller 20, joining a cliché 30 on which patterns corresponding to the conductive patterns are recessed with the blanket 21 to selectively remove the portions of conductive ink composition 40A that are unnecessary for the formation of the conductive patterns, thereby forming patterns 40 of the conductive ink composition that correspond to the conductive patterns on the blanket 21, and then joining the blanket 21 with the semiconductor structure 100 to transfer the patterns 40 of the conductive ink composition on the blanket 21 onto the semiconductor structure 100.

Next, the roll printing process is repeated at least once until the thickness of the patterns transferred onto the semiconductor structure 100 reaches a desired thickness, thereby forming the conductive patterns 300.

As the roll print process is carried out on the surface from which the height difference due to the openings 140 is removed by the first conductive layer 200, defects such as pattern lifting, peeling, and the like occur less frequently.

The conductive patterns 300 may include any one of Ag paste, a conductive material including Ag paste and polymer, and a conductive material including Cu paste and polymer.

After the step of forming the conductive patterns 300, a sintering process may be carried out at a temperature of approximately 250° C. for a duration of 10 to 40 minutes.

Figure 9:
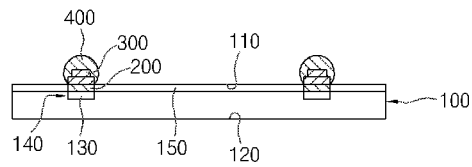

Referring to FIG. 9, a second conductive layer 400 is formed over the conductive patterns 300 so as to surround the conductive patterns 300. The second conductive layer 400 may be formed by growing an electroless plating layer from the surface of the conductive patterns 300 using an electroless plating process. The second conductive layer 400 may include at least one of Ni, Ni alloy, Au, Au alloy, Pt, and Pt alloy, but preferably formed of a stacked layer of, for example, Ni/Au for the prevention of oxidation.

Thereafter, conductive connection members 600 such as solders described in FIGS. 1A and 1B are formed over the second conductive layer 400, and the semiconductor structure 100 is mounted to an additional semiconductor device 500 such that the second conductive layer 400 is electrically connected with connection electrodes 530 of the additional semiconductor device 500 by the medium of the conductive connection members 600, thereby forming the semiconductor device illustrated in FIGS. 1A and 1B.

Although the present embodiment is illustrated and described for when the conductive patterns 300 are formed as bumps, the second conductive layer 400 may be formed so as to surround the conductive patterns 300, and the second conductive layer 400 and the connection electrode 530 of the additional semiconductor structure 500 may be electrically connected by the medium of the conductive connection member 600 made of a solder. It would also be possible to form the semiconductor device shown in FIG. 2 where the conductive patterns 300 are formed as redistribution lines, the second conductive layer 400 is formed over only some portion of the conductive patterns 300, and the second conductive layer 400 and the connection electrodes 530 of the additional semiconductor structure 500 are electrically connected by the medium of the conductive connection members 600 made of a wire.

In accordance with the above described embodiments, as the roll printing process for forming the conductive patterns 300 is applied over the surface which has been made uniform by the first conductive layer 200, generation of defects such as pattern lifting, peeling, and the like is prevented, thus improving mechanical reliability. In addition, as the second conductive layer 400 with excellent adhesiveness with a solder is formed over the conductive patterns 300 to improve the adhesiveness with the solder, electrical reliability is improved. Furthermore, since it is possible to use the roll printing process advantageously, the use of which was difficult due to its poor mechanical and electrical reliability, to form the conductive patterns 300 such as bumps, redistribution lines, and the like, a simpler process and reduced manufacturing cost are achieved in comparison with the conventionally used photolithography process.

The semiconductor device in accordance with the various embodiments may be applied to a variety of electronic apparatuses.

Figure 10:
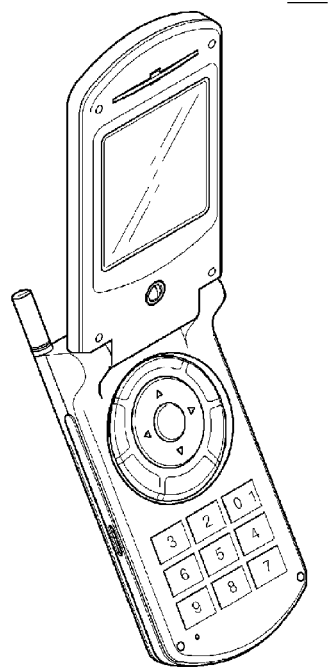
FIG. 10 is a perspective view illustrating an electronic apparatus having the semiconductor device in accordance with various embodiments.

FIG. 10 is a perspective view illustrating an electronic apparatus having the semiconductor device in accordance with various embodiments.

In FIG. 10, the semiconductor device in accordance with various embodiments may be applied to an electronic apparatus 1000 such as a mobile phone, which may prove to be advantageous by improving the price competitiveness and reliability of the electronic apparatus 1000 since it may be manufactured with a simpler process at a lower cost with improved mechanical and electrical reliability. The electronic apparatus 1000 is not limited to the mobile phone shown in FIG. 10, and may include various electronic appliances, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 11:
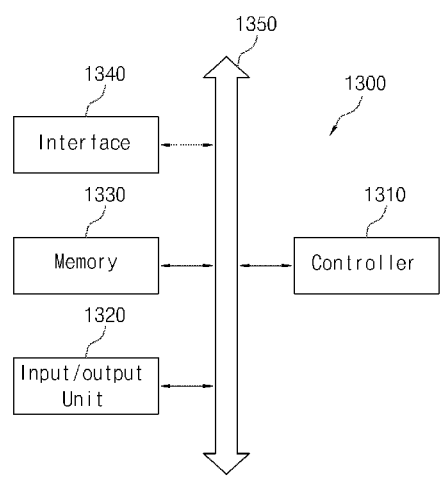
FIG. 11 is a system block diagram showing an electronic system to which the semiconductor device in accordance with various embodiments is applied.

FIG. 11 is a block diagram showing an electronic apparatus which may include the semiconductor package according to various embodiments.

In FIG. 11, an electronic system 1300 may include a controller 1310, an input/output unit 1320, and a memory 1330, which collectively may be coupled with one another through a bus 1350. The bus 1350 serves as a path through which data move, and may include at least any one of a microprocessor, a digital signal processor, a microcontroller, and logic devices capable of performing substantially similar functions as these components. The controller 1310 and the memory 1330 may include the semiconductor device according to various embodiments of the present invention. The input/output unit 1320 may include at least one keypad, a keyboard, a display device, and so forth. The memory 1330 is a device for storing data, and may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desktop computer. The flash memory may be constituted by a solid state drive (SSD), at which the electronic system 1300 may stably store a large amount of data in a flash memory system. The electronic system 1300 may further include an interface 1340 configured to transmit and receive data to and from a communication network. The interface 1340 may be a wired or wireless type, and may include an antenna or a wired or wireless transceiver. Further, while not shown, a person skilled in the art will readily appreciate that the electronic system 1300 may be additionally provided with an application chipset, a camera image processor (CIS), etc.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
preparing a semiconductor structure formed with openings for exposing pads on an one surface thereof;

forming a first conductive layer in the openings to make the one surface of the semiconductor structure more uniform; and forming conductive patterns on portions of the one surface of the semiconductor structure including the first conductive layer with a roll printing process, wherein the step of forming the first conductive layer comprises the steps of:

forming a conductive layer on the one surface of the semiconductor structure including the openings to fill the openings; and polishing the conductive layer such that only the conductive layer remains in the openings.

2. The method according to claim 1, wherein the step of forming the conductive patterns comprises a unit cycle process comprising the steps of:

forming patterns of conductive ink composition in recessed portions of a cliché on which patterns corresponding to the conductive patterns are recessed;

joining a roller with the cliché to transfer the patterns of the conductive ink composition on the cliché onto the roller; and transferring the patterns of the conductive ink composition on the roller onto the one surface of the semiconductor structure including the first conductive layer, wherein the unit cycle process is repeated at least one time.

3. The method according to claim 1, wherein the step of forming the conductive patterns comprises a unit cycle process comprising of the steps of:

coating a conductive ink composition on a roller;

joining a cliché, on which patterns corresponding to the conductive patterns are recessed, with the roller to form patterns of the conductive ink composition on the roller that corresponds to the conductive patterns on the roller; and transferring the patterns of the conductive ink composition on the roller onto the one surface of the semiconductor structure including the first conductive layer, wherein the unit cycle process is repeated at least one time.

4. The method according to claim 1, further comprising, after the step of forming the conductive patterns, the step of sintering the conductive patterns.

5. The method according to claim 1, wherein the conductive patterns comprise any one of a bump and a redistribution line.

6. The method according to claim 1, further comprising, after the step of forming the conductive pattern, the step of forming a second conductive layer on the conductive patterns.

7. The method according to claim 6, wherein the step of forming the second conductive layer is carried out using an electroless plating process.

8. The method according to claim 6, wherein the step of forming the second conductive layer is carried out such that the second conductive layer is formed on the entire surface of the conductive patterns.

9. The method according to claim 6, wherein the step of forming the second conductive layer is carried out so that the second conductive layer is formed on a portion of the conductive patterns.

10. A method for manufacturing a semiconductor device, comprising the steps of:

preparing a semiconductor structure formed with openings for exposing pads on an one surface thereof;

forming a first conductive layer in the openings to make the one surface of the semiconductor structure more uniform; and forming conductive patterns on portions of the one surface of the semiconductor structure including the first conductive layer with a roll printing process, wherein the step of forming the first conductive layer comprises the steps of:

filling conductive paste in the openings; and sintering the conductive paste filled in the openings.

11. The method according to claim 10, wherein the step of forming the conductive patterns comprises a unit cycle process comprising the steps of:

forming patterns of conductive ink composition in recessed portions of a cliché on which patterns corresponding to the conductive patterns are recessed;

joining a roller with the cliché to transfer the patterns of the conductive ink composition on the cliché onto the roller; and transferring the patterns of the conductive ink composition on the roller onto the one surface of the semiconductor structure including the first conductive layer, wherein the unit cycle process is repeated at least one time.

12. The method according to claim 10, wherein the step of forming the conductive patterns comprises a unit cycle process comprising of the steps of:

coating a conductive ink composition on a roller;

joining a cliché, on which patterns corresponding to the conductive patterns are recessed, with the roller to form patterns of the conductive ink composition on the roller that corresponds to the conductive patterns on the roller; and transferring the patterns of the conductive ink composition on the roller onto the one surface of the semiconductor structure including the first conductive layer, wherein the unit cycle process is repeated at least one time.

13. The method according to claim 10, further comprising, after the step of forming the conductive patterns, the step of sintering the conductive patterns.

14. The method according to claim 10, wherein the conductive patterns comprise any one of a bump and a redistribution line.

15. The method according to claim 10, further comprising, after the step of forming the conductive pattern, the step of forming a second conductive layer on the conductive patterns.

16. The method according to claim 15, wherein the step of forming the second conductive layer is carried out using an electroless plating process.

17. The method according to claim 15, wherein the step of forming the second conductive layer is carried out such that the second conductive layer is formed on the entire surface of the conductive patterns.

18. The method according to claim 15, wherein the step of forming the second conductive layer is carried out so that the second conductive layer is formed on a portion of the conductive patterns.

* * * * *